US010545017B2

(12) United States Patent
Yamaguchi et al.

(10) Patent No.: US 10,545,017 B2
(45) Date of Patent: Jan. 28, 2020

(54) OVERLAY ERROR MEASURING DEVICE AND COMPUTER PROGRAM FOR CAUSING COMPUTER TO MEASURE PATTERN

(71) Applicant: HITACHI HIGH-TECHNOLOGIES CORPORATION, Tokyo (JP)

(72) Inventors: Satoru Yamaguchi, Tokyo (JP); Kei Sakai, Tokyo (JP); Osamu Inoue, Tokyo (JP); Kazuyuki Hirao, Tokyo (JP); Osamu Komuro, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/413,198

(22) PCT Filed: Jun. 5, 2013

(86) PCT No.: PCT/JP2013/065526
§ 371 (c)(1),
(2) Date: Jan. 6, 2015

(87) PCT Pub. No.: WO2014/007017
PCT Pub. Date: Jan. 9, 2014

(65) Prior Publication Data
US 2015/0285627 A1 Oct. 8, 2015

(30) Foreign Application Priority Data

Jul. 6, 2012 (JP) .................. 2012-152008

(51) Int. Cl.
G01B 15/00 (2006.01)
G03F 7/20 (2006.01)
(Continued)

(52) U.S. Cl.
CPC ......... *G01B 15/00* (2013.01); *G03F 7/70633* (2013.01); *H01J 37/26* (2013.01); *H01L 22/12* (2013.01)

(58) Field of Classification Search
CPC ....... G01B 15/00; G03F 7/70633; H01J 37/26
(Continued)

(56) References Cited

U.S. PATENT DOCUMENTS 6,091,547 A * 7/2000 Gardiner .................. F21V 5/02
359/621
8,019,161 B2 * 9/2011 Morokuma ........ G01N 23/2251
382/190

(Continued)

FOREIGN PATENT DOCUMENTS

JP 61-97510 A 5/1986
JP 7-151514 A 6/1995
(Continued)

OTHER PUBLICATIONS

Dwyer and et al, Effect of Luminance-Matched Wavelength on Depth Discrimination at Scotopic and Photopic Levels of Target Illumination, 1970, Journal of Optical Society of America, vol. 60, Issue 1, Abstract.*
(Continued)

Primary Examiner — Sujoy K Kundu
Assistant Examiner — Douglas Kay
(74) Attorney, Agent, or Firm — Volpe and Koenig, P.C.

(57) ABSTRACT

The purpose of the present invention is to provide an overlay error measuring device which measures an overlay error with high accuracy even when a lower layer pattern is disposed under a thin film and a sufficient signal amount cannot be ensured. The present invention proposes an overlay error measuring device provided with an arithmetic processing unit for measuring a pattern formed on a sample (Continued)

on the basis of a signal waveform obtained by a charged particle beam device. The arithmetic processing unit finds a correlation with the signal waveform using a partial waveform obtained on the basis of partial extraction of the signal waveform, forms a correlation profile indicating the correlation, and measures an overlay error using the correlation profile.

14 Claims, 14 Drawing Sheets

(51) Int. Cl.
*H01J 37/26* (2006.01)
*H01L 21/66* (2006.01)

(58) Field of Classification Search
USPC .................................. 702/150; 140/13
See application file for complete search history.

(56) References Cited

U.S. PATENT DOCUMENTS

| | | | | |
|---|---|---|---|---|
| 8,148,682 | B2 * | 4/2012 | Hotta | G03F 7/70466 250/307 |
| 8,953,894 | B2 * | 2/2015 | Sato | G06K 9/00127 382/145 |
| 9,000,365 | B2 * | 4/2015 | Mochizuki | G01B 15/00 250/306 |
| 2002/0041377 | A1 * | 4/2002 | Hagiwara | G03F 7/706 356/399 |
| 2006/0263706 | A1 | 11/2006 | Yim | |
| 2006/0274312 | A1 * | 12/2006 | Endo | G03F 7/70633 356/400 |
| 2007/0023653 | A1 * | 2/2007 | Toyoda | G06T 7/0006 250/310 |
| 2008/0106714 | A1 * | 5/2008 | Okita | G03F 7/70633 355/53 |
| 2008/0117434 | A1 * | 5/2008 | Verstappen | G01B 11/24 356/521 |
| 2009/0200465 | A1 * | 8/2009 | Sutani | H01J 37/265 250/311 |
| 2009/0242760 | A1 * | 10/2009 | Miyamoto | G01B 15/00 250/307 |
| 2011/0026032 | A1 * | 2/2011 | Den Boef | G01N 21/9501 356/446 |
| 2011/0155904 | A1 | 6/2011 | Hotta et al. | |
| 2011/0158543 | A1 * | 6/2011 | Morokuma | G01B 15/04 382/199 |
| 2011/0262043 | A1 | 10/2011 | Sato et al. | |
| 2012/0123581 | A1 * | 5/2012 | Smilde | G03F 7/70483 700/105 |
| 2012/0126116 | A1 | 5/2012 | Tanaka et al. | |
| 2012/0211653 | A1 * | 8/2012 | Sutani | H01J 37/265 250/310 |
| 2012/0292502 | A1 | 11/2012 | Langer et al. | |

FOREIGN PATENT DOCUMENTS

| | | | | |
|---|---|---|---|---|
| JP | 07151514 | * | 6/1995 | ............ G01B 11/00 |
| JP | 2006-324631 A | | 11/2006 | |
| JP | 2007-248087 A | | 9/2007 | |
| JP | WO-2010119641 | * | 10/2010 | ............ G01B 15/04 |
| JP | 2011-033423 A | | 2/2011 | |
| JP | 2011-142321 A | | 7/2011 | |
| JP | 2012-177961 A | | 9/2012 | |
| JP | 2012-244142 A | | 12/2012 | |
| WO | 2010/038859 A1 | | 4/2010 | |

OTHER PUBLICATIONS

Googler Scholar Search report on "deflection coil scanning charge particle beam".*
International Search Report PCT/JP2013/065526 dated Aug. 27, 2013 with full English translation.

* cited by examiner

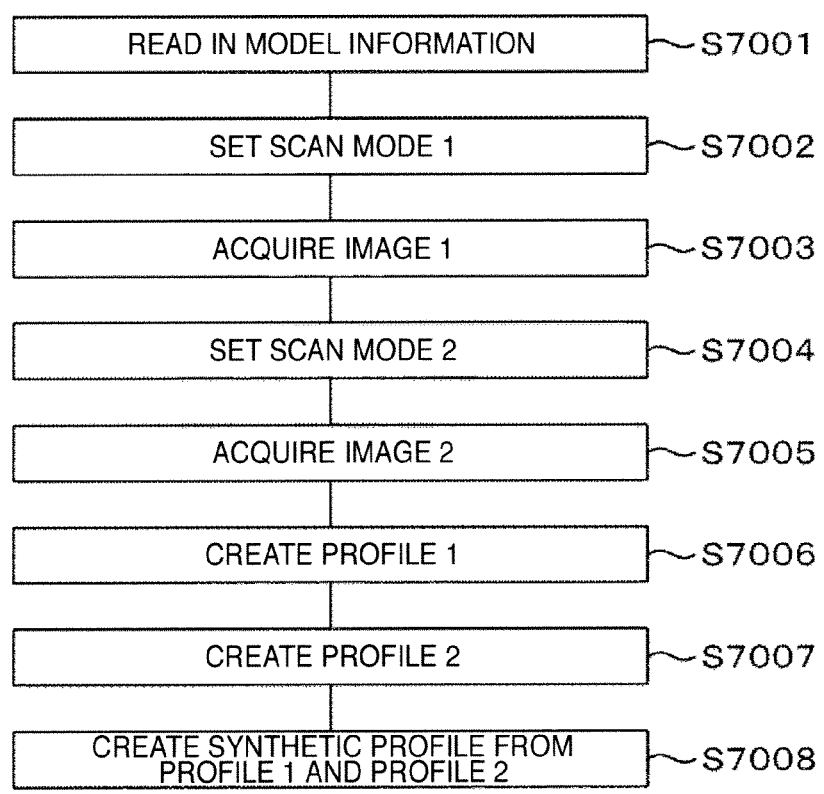

OVERLAY ERROR MEASURING DEVICE AND COMPUTER PROGRAM FOR CAUSING COMPUTER TO MEASURE PATTERN

CROSS REFERENCE TO RELATED APPLICATIONS

This application is the U.S. National Phase of PCT/JP2013/065526 filed Jun. 5, 2013, which claims priority from Japanese Patent Application No. 2012-152008 filed Jul. 6, 2012. The subject matter of each is incorporated herein by reference in entirety.

TECHNICAL FIELD

The present invention relates to a measuring device for executing pattern measurement. In particular, the present invention relates to an overlay error measuring device for evaluating deviation between layers of a semiconductor device having a multilayer structure, and a computer program.

BACKGROUND ART

With demand for size shrinking of a pattern formed on a sample in a semiconductor process in recent years, improvement of the overlay precision of patterns over a plurality of layers of an exposure device is demanded. It is considered to become increasingly important to measure overlay with high precision and feedback the measured overlay to the exposure device. In a conventional main stream, an optical overlay measuring device is used in overlay measurement. In the optical overlay measuring device, however, there is a measuring precision limit and a wide pattern area is needed for overlay measurement. Furthermore, in principle, it is difficult for the optical overlay measuring device to detect overlay deviation caused by high-order distortion in the exposure device.

On the other hand, a charged particle beam device such as a scanning electron microscope can acquire a high resolution image of a high magnification, and consequently deviation between layers can be measured accurately.

In Patent Literature 1, a technique of measuring a dimension between patterns belonging to a plurality of layers by using a scanning electron microscope (SEM) is described. According to a measurement method as disclosed in Patent Literature 1, an image representing an actual pattern which is actually formed can be used, and consequently a dimension between patterns can be measured with very high precision.

In Patent Literature 2, an overlay vernier for aligning between an upper layer and a lower layer on a wafer and a semiconductor device manufacturing method using the overlay vernier are disclosed.

CITATION LIST

Patent Literature

PATENT LITERATURE 1: JP-A-2007-248087 (corresponding to U.S. Pat. No. 8,019,161)
PATENT LITERATURE 2: JP-A-2006-324631 (corresponding to U.S. Patent Publication No. 2006/0263706)

SUMMARY OF INVENTION

Technical Problem

An image obtained by a charged particle beam device is formed on the basis of detection of electrons or ions emitted from a sample. For example, in a case where a film is formed between layers, therefore, information of a lower layer becomes insufficient as compared with an upper layer because of existence of particles that cannot pass through the film. In general, measurement of a dimension between patterns using a scanning electron microscope is conducted by measuring a dimension between contour lines formed on the basis of a dimension between peaks of a luminance profile and an SEM image. Since information of the lower layer pattern is scant, it becomes difficult to secure a sufficient measurement precision in some cases.

In Patent Literatures 1 and 2, there is no description at all as regards a solution in a case where the signal quantity of the lower layer is insufficient.

Hereafter, an overlay error measuring device and a computer program aiming at conducting an overlay error measurement with high precision even in a case where a lower layer pattern is disposed under a thin film and a sufficient signal quantity cannot be secured.

Solution to Problem

As one aspect for achieving the object, an overlay error measuring device including an arithmetic processing device which conducts measurement on patterns formed on a sample, on the basis of a signal waveform obtained by a charged particle beam device, the arithmetic processing device finding correlation with the signal waveform by using a partial waveform obtained on the basis of partial extraction of the signal waveform, forming a correlation profile which indicates the correlation, and measuring a dimension between patterns belonging to different layers by using the correlation profile, and a computer program are proposed hereafter.

As another aspect for achieving the object, an overlay error measuring device including an arithmetic processing device which conducts measurement on patterns formed on a sample, on the basis of a signal waveform obtained by a charged particle beam device, the arithmetic processing device discriminating a part of the signal waveform having a luminance of at least a predetermined value and a part of the signal waveform having a luminance less than the predetermined value, extracting a first measurement reference from the part having a luminance of at least the predetermined value, extracting a second measurement reference from the part having a luminance less than the predetermined value, and measuring a dimension between the first measurement reference and the second measurement reference, and a computer program are proposed.

Advantageous Effects of Invention

According to the above-described configuration, it becomes possible to conduct an overlay error measurement with high precision even in a case where a lower layer pattern is disposed under a thin film and a sufficient signal quantity cannot be secured.

BRIEF DESCRIPTION OF DRAWINGS

FIG. 18 is a flow chart showing a process of a further different overlay error measurement.

DESCRIPTION OF EMBODIMENTS

Figure 1:
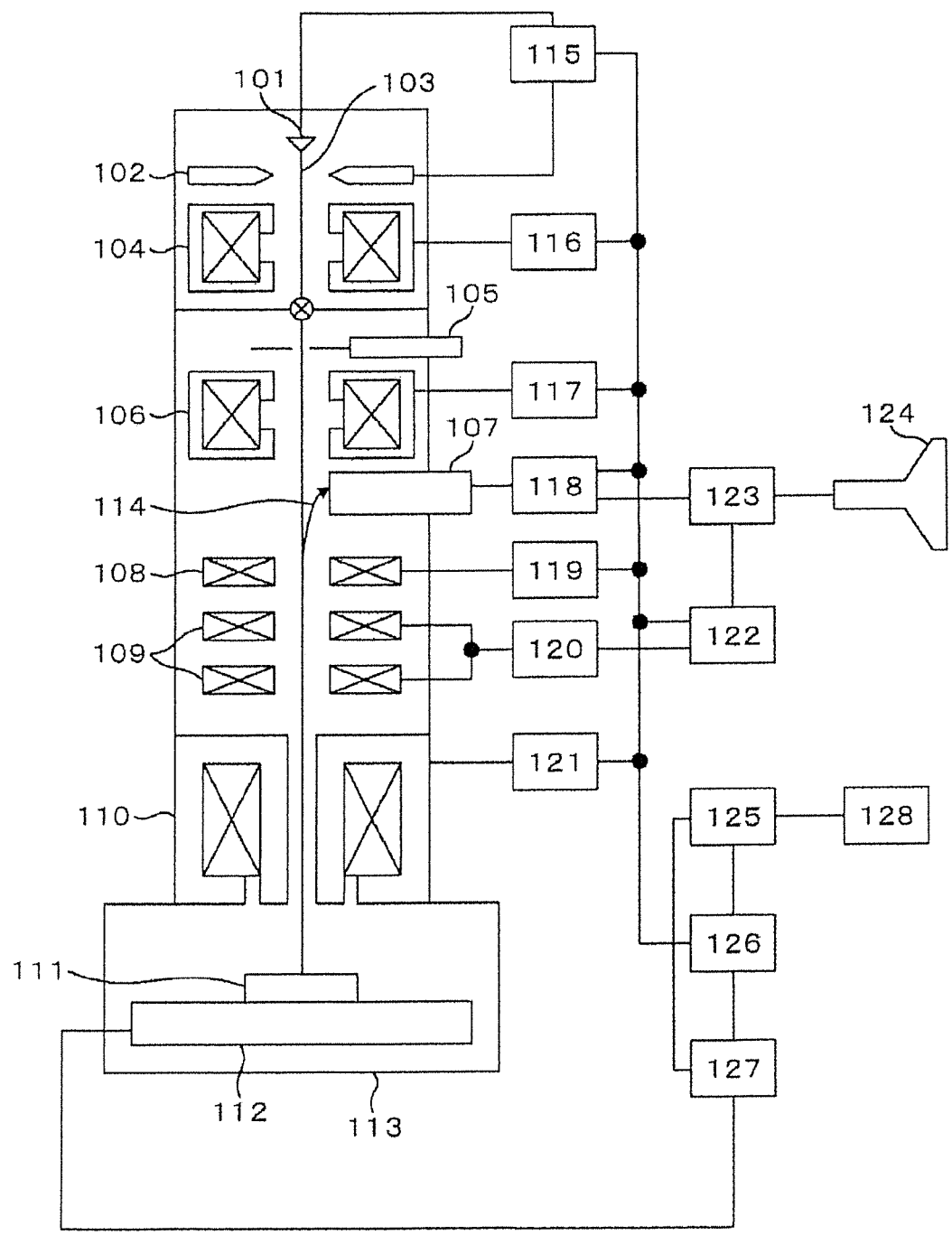
FIG. 1 is a diagram showing an outline of a scanning electron microscope.

In a case where overlay measurement using a charged particle beam is executed, there is an advantage that the resolution is high. On the other hand, depending upon a material quality of a sample pattern, the profile of the particle charged beam intensity becomes nonsymmetrical because of charging in some cases. In a nonsymmetrical profile caused by such a charged particle beam device, the overlay cannot be measured with high precision. Therefore, control for obtaining a symmetrical profile is important.

If measurement using a pattern edge as a reference is conducted when conducting overlay error measurement, deviation caused by pattern deformation and an overlay error are mixed because of an optical proximity effect (OPE) and other pattern deformation factors, and consequently high precision overlay error measurement becomes difficult in some cases. If a distance between center of gravity points of patterns can be measured, therefore, it is possible to prevent occurrence of a measurement error corresponding to pattern deformation.

On the other hand, in overlay measurement using a charged particle beam, a signal from a lower layer pattern is charged particles that have passed a film between an upper layer and the lower layer. Therefore, its signal intensity is weak, and in principle center of gravity detection using the conventional edge detection is difficult in some cases. In other words, the center of gravity position cannot be identified accurately in some cases. The pattern in the lower layer differs in view from a pattern in the upper layer because of processing conducted until the patterns are formed and the film between the upper layer and the lower layer. Therefore, it is desirable to use different methods as the edge detection method. Furthermore, there is a technique of registering a template or the like beforehand and measuring template matching using the template or a difference from the template. If information of the lower layer is insufficient, however, a matching error or lowering in measurement precision is caused in some cases.

In addition, at the time of semiconductor process development, the overlay deviation is intentionally made large in order to optimize the condition of the exposure device sometimes. In some cases, however, pattern edges of the upper layer and the lower layer overlap and it becomes difficult to separate edges.

Furthermore, depending upon the pattern, it is impossible in some cases to automatically discriminate a pattern of an upper layer and a pattern of a lower layer and detect a center of gravity. Furthermore, it is difficult to stably detect a center of gravity against a contrast change caused by focus blurring or position deviation between the upper layer and the lower layer.

In some cases, the precision of the center of gravity measurement is lowered by non-symmetry or pattern crumbling in an outside pattern caused by non-uniformity of energy density of light in the exposure device. Furthermore, in some cases, the precision of the center of gravity measurement is lowered by non-symmetry in a profile generated by charging of a local pattern caused by irradiation with a charged particle beam.

In some cases, a pattern itself becomes non-symmetrical because of non-uniformity of density of light energy at the time of exposure. In such a pattern, the position of center of gravity cannot be calculated correctly, resulting in lowered precision of overlay measurement.

In a case of automatic operation of overlay measurement, a file (hereafter referred to as recipe file) describing position information of an overlay pattern and an observation condition of the charged particle beam device is created beforehand. At the time of automatic operation, the recipe file is read out and the operation is executed in accordance with described information. For detecting an edge of an overlay measuring pattern, it was necessary to specify edge detection ranges of all upper layer patterns and lower layer patterns in the visual field. Furthermore, it was necessary to individually set a threshold value that defines an edge position with respect to a signal strength profile. A displayed edge detection position is secondary information in the overlay measurement, and it was impossible to view deviation intuitively.

In an embodiment described below, in view of the technical problems in conducting the overlay error measurement as described above, an overlay error measuring device that creates a template waveform on the basis of partial extraction of a signal waveform obtained by an imaging device, creates a correlation value profile by searching the signal waveform using the template waveform, and executes interlayer measurement by using the correlation value profile will be described. Furthermore, an example in which an inverted template is created by inverting the template waveform and a correlation value profile is created by search using the inverted template will be described.

The correlation value profile becomes a symmetry evaluation profile by the search using the inverted template. The symmetry evaluation profile exhibits the degree of partial symmetry (lateral symmetry) of a waveform signal.

It becomes possible to find a measurement reference of overlay error measurement accurately even for a lower layer pattern which is less in signal quantity by conducting measurement using not a signal waveform which indicates a quantity of a detected signal but a profile which evaluates a shape of a signal waveform in this way.

In addition, in the present embodiment, a method of scanning an area including a pattern in a first layer formed on a sample and a pattern in a second layer formed separately from the pattern in the first layer with a charged particle beam, creating a profile of charged particle beam intensity on the basis of charged particles emitted from the scanned place, discriminating the patterns of the two kinds by using a discrimination method based upon a feature value calculated from the profile, finding a center of gravity of the pattern in the first layer and a center of gravity in the second layer, and calculating a difference between the centers of gravity will be proposed.

Symmetry is found from a profile of the charged particle beam intensity every pattern. From intensity of the symmetry, an upper layer and a lower layer are discriminated and positions of center of gravity are detected. From a difference between positions of center of gravity, deviation between the upper layer pattern and the lower layer pattern is measured. Even in a case where the signal of the lower layer pattern is weak, it is not necessary to conduct edge detection and stable overlay measurement is possible.

In an embodiment described below, the point that the emission quantity of charged particles from a first layer differs from that from a second layer is utilized in order to discriminate a pattern in the first layer and a pattern in the second layer. The difference depends upon a process for forming the pattern in the first layer and the pattern in the second layer and upon an interlayer film. Discrimination is possible by comparing an image contrast difference and a signal intensity profile difference which appear as a result.

In addition, it is also possible to compare the signal intensity and conduct discrimination on the basis of only the center of gravity position of the pattern in the first layer and the center of gravity position of the pattern in the second layer which are found. Charging of a local pattern caused by irradiation with a charged particle beam is averaged by conducting scanning with a first scan direction and a second scan direction forming 180 degrees.

Symmetry is found from a profile of the charged particle beam intensity every pattern. A pattern for which center of gravity calculation is to be conducted selectively is determined on the basis of intensity of the symmetry and a pattern arrangement.

An upper layer and a lower layer are discriminated on the basis of symmetry of every pattern found from the profile of the charged particle beam intensity and information registered by an operator beforehand (the number of patterns and an inter-pattern pitch in the first layer and the number of patterns and an inter-pattern pitch in the second layer). A difference is calculated from centers of gravity in the first layer and the second layer. A schematic sectional view, pattern positions, and deviation are displayed on an image display device in a superposed form on the basis of detected center of gravity positions.

According to the embodiment described below, it becomes possible in overlay measurement using a charged particle beam to stably detect a center of gravity from a weak charged particle signal of a lower layer pattern. The pattern in the lower layer differs from the pattern in the upper layer in view because of processing conducted until the pattern is formed and a film between the upper layer and the lower layer. However, it is also possible to conduct accurate overlay error measurement without changing an edge detection method between the upper layer and the lower layer by using symmetry of the profile of the charged particle beam intensity as an evaluation reference. In addition, at the time of development of a semiconductor process, the overlay deviation is intentionally made large in order to optimize the condition of the exposure device in some cases. Even for such a pattern, it is possible to detect the center of gravity position by using the symmetry of the profile of the charged particle beam intensity.

The upper layer pattern and the lower layer pattern can be automatically discriminated by using the symmetry profile used to detect the center of gravity. Furthermore, even for a contrast change caused by focus blurring or position deviation between the upper layer and the lower layer, it becomes possible to stably conduct center of gravity detection. As a result, focusing processing which requires the longest processing time at the time of automatic operation of overlay measurement in the charged particle beam device can be simplified and the throughput can be improved without lowering the precision.

Owing to the fast reciprocating scanning method, non-symmetry of the profile caused by charging of a local pattern can be mitigated and the precision of the center of gravity measurement can be improved. As a result, the number of patterns required to obtain precision that is required for overlay measurement can be decreased. Accordingly, the ratio of an area occupied in a semiconductor chip can be decreased.

The precision of the overlay measurement can be improved by evaluating non-symmetry or pattern crumbling in an outside pattern caused by non-uniformity of energy density of light in the exposure device and restricting a pattern used in center of gravity calculation (for example, using only an inside pattern).

The operator can specify overlay measurement by only inputting minimum required information without inputting troublesome edge detection parameters. Owing to automatic discrimination, the work such as pattern position specification for overlay measurement can be lightened. Deviation can be viewed intuitively by displaying a schematic sectional view, pattern positions, and deviation on an image display device in a superposed form on the basis of detected center of gravity positions. Therefore, it can be determined easily in recipe registration work whether parameters are suitable.

Embodiment 1

FIG. 1 is a block diagram showing a schematic configuration of a scanning electron microscope. A general control unit 125 controls the whole device via an electro-optical system control device 126 and a stage control device 127 on the basis of an electron acceleration voltage, information of a wafer 111, observation position information and so forth which are input from a user interface 128 by an operator. The wafer 111 is passed through a sample exchange chamber via a sample conveyance device which is not illustrated, and then fixed on a stage 112 in a sample chamber 113.

The electro-optical system control device 126 controls a high voltage control device 115, a first condenser lens control unit 116, a second condenser lens control unit 117, a secondary electron signal amplifier 118, an alignment control unit 119, a deflection signal control unit 122, and an object lens control unit 121 in accordance with an instruction from the general control unit 125.

A primary electron beam 103 extracted from an electron source 101 by an extraction electrode 102 is focused by a first condenser lens 104, a second condenser lens 106, and an object lens 110, and applied onto the wafer 111 (sample). On the way, the electron beam is passed through a diaphragm 105 and adjusted in trajectory by an alignment coil 108. Furthermore, the electron beam is caused to scan the top of the sample two-dimensionally by deflection coils 109 which receive a signal from a deflection signal control unit 122 via a deflection signal control unit 120. Secondary electrons 114 emitted from the wafer 111 by irradiation of the wafer 111 with the primary electron beam 103 are seized by a secondary electron detector 107 and used as a luminance signal of a secondary electron image display device 124 via a secondary electron signal amplifier 118. Since a deflection signal of the secondary electron image display device 124 is in synchronization with a deflection signal of the deflection coil, a pattern shape on the wafer 111 is reproduced on the secondary electron image display device 124 faithfully.

Furthermore, in order to create an image to be used to measure a dimension of the pattern, a signal that is output from the secondary electron signal amplifier 118 is subject to AD conversion in an image processing processor 123, and digital image data is created. In addition, a secondary electron profile is created from the digital image data.

A range to be measured is selected from the created secondary electron profile manually or automatically on the basis of a determinate algorithm, and the number of pixels in the selected range is calculated. An actual dimension on the sample is measured on the basis of an actual dimension of an observation area scanned with the primary electron beam 103 and the number of pixels corresponding to the observation area.

By the way, in the foregoing description, a scanning electron microscope using an electron beam is taken as an example of the charged particle beam device. However, the charged particle beam device is not restricted to the scanning electron microscope, but the charged particle beam device may be, for example, an ion beam irradiation using an ion beam. Furthermore, in the ensuing description, an execution subject which executes processing described later is referred to as arithmetic processing device in some cases.

Figure 2:
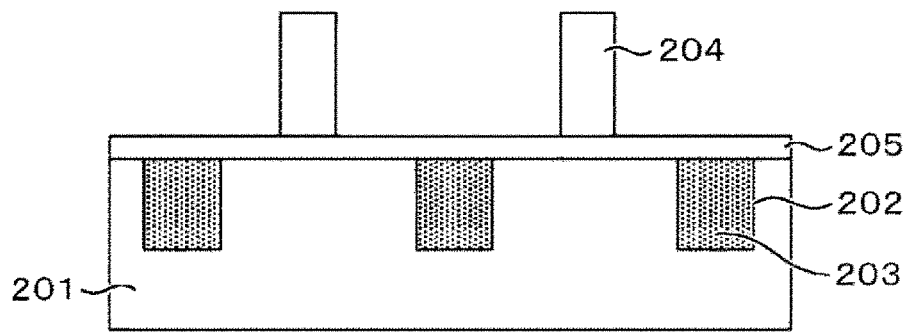
FIG. 2 is a sectional view of a pattern that becomes a target of overlay error measurement.

FIG. 2 shows a sectional view of a representative pattern example (hereafter referred to as overlay pattern) used in overlay measurement. The pattern used in overlay measurement is formed so as not to overlap when a pattern corresponding to two layers, i.e., an upper layer and a lower layer is observed from above. As for the lower layer pattern, various shapes are conceivable. As a representative example, however, a lower layer pattern 203 buried in a trench 202 formed in a wafer 201 is shown. An upper layer pattern 204 is formed by a process different from that of the lower layer pattern 203, and the upper layer pattern 204 is formed in a position shifted from the lower layer pattern by approximately half pitch. By the way, a reflection preventing film 205 is formed between the upper layer and the lower layer to prevent interference of light at the time of exposure. By the way, the pattern described here is an example of the overlay pattern, and the pattern may be an overlay pattern formed by double exposure or self aligned double patterning.

Figure 3:
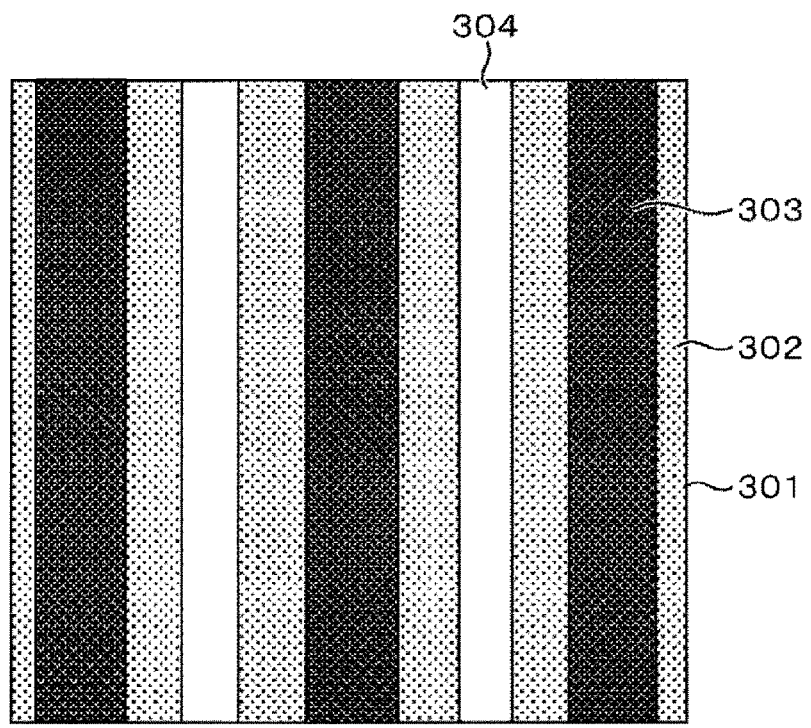
FIG. 3 is a diagram showing an example of an electron microscope image of a pattern that becomes a target of overlay error measurement.

FIG. 3 shows an electron microscope image 301 of an overlay pattern formed on the sample. In the electron microscope image, a part 304 that is high in luminance and that looks white is a secondary electron signal of the upper layer pattern 204, and a part 303 that is low in luminance and that looks black is a secondary electron signal of the lower layer pattern 203. 302 corresponds to the lower layer pattern from a wafer surface which is a base. By the way, the luminance depends upon a material which forms a pattern or the base.

Figure 4:
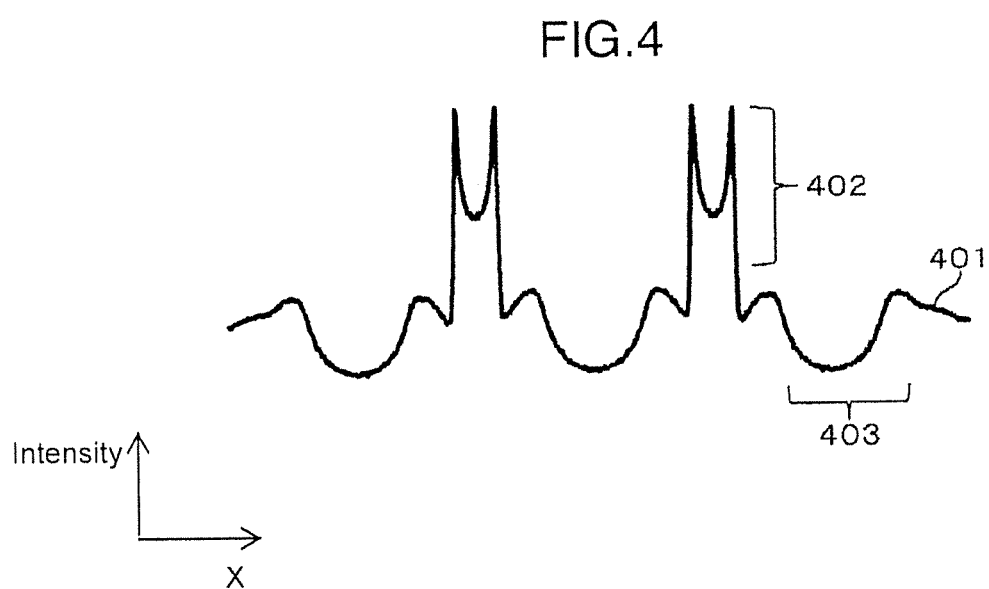
FIG. 4 is a diagram showing a secondary electron profile of a pattern that becomes a target of overlay error measurement.

FIG. 4 shows a secondary electron profile 401 created from the electron microscope image 301. The secondary electron file is created by conducting projection processing on the whole or a part of the electron microscope image 301 in the x direction. In the secondary electron profile 401, a profile (the upper layer pattern profile 402) of a part corresponding to the upper layer pattern 204 becomes high and a profile (the lower layer pattern profile 403) of a part corresponding to the lower layer pattern 203 becomes low. In addition, a peak caused by an edge effect of secondary electrons is seen on the left and right of the upper layer pattern profile 402. This is because in a case where an edge part where planes having different angles are in contact is scanned with an electron beam, secondary electrons become easy to be emitted in the edge part than the planes. As the edge becomes sharper, the quantity of emitted secondary electrons increases. Conversely, in the profile 403 of the part corresponding to the lower layer pattern 203, there isn't an edge part as a shape, and a difference in emitted secondary electron quantity caused by a difference in material quality between the wafer 201 and the lower layer pattern 203 appears as a difference in luminance. In addition, since secondary electrons are emitted through the reflection preventing film 205, a signal reflecting shape information decreases.

In the present embodiment, a pattern is recognized by utilizing a difference between processes in which secondary electron signals of the upper layer pattern 204 and the lower layer pattern 203 are generated. Furthermore, symmetry of the formed pattern itself and symmetry of pattern arrangement are utilized to detect position deviation.

A discrimination method of the upper layer pattern and the lower layer pattern and a method for calculating position deviation will now be described with reference to the secondary electron profile 401 and a symmetry profile 501 created from the electron microscope image 301 shown in FIG. 5 and a flow diagram shown in FIG. 15. The ensuing processing may be conducted by an arithmetic processing device in the SEM. The ensuing processing may be executed by an external computer in accordance with a computer program. A computer which executes measurement processing has a storage medium mounted thereon to store the computer program. Furthermore, it is also possible to use an arithmetic processing device having a storage medium capable of storing image data and signal waveform information acquired by an imaging device such as an SEM and executing the above-described processing or processing described later, as an overlay error measuring device.

Model information which will be described later is read into the image processing processor 123 (S5001). Then, the electron microscope image 301 is taken into the image processing processor 123 (S5002). The secondary electron profile 401 which is a projection profile is created from an arbitrary position of the electron microscope image 301 (S5003). Then, a symmetry profile is created by calculating a correlation value with an inverted profile part while scanning the secondary electron profile 401 with an arbitrary area 520 (S5004).

By the way, the symmetry profile 501 is a correlation profile that indicates correlation between a signal waveform obtained on the basis of a partially extracted waveform and the secondary electron profile 401. And the symmetry profile 501 indicates correlation between the partial waveform and each position in the secondary electron profile 401. Especially in the case of the present embodiment, a partial waveform for searching the secondary electron profile 401 is created by extracting a waveform including a part having the lowest luminance from a signal waveform as a partial area and inverting the extracted waveform. A pattern judged to be high in correlation even if an inverted pattern is used is symmetrical pattern in which the left and right shapes are symmetrical. Therefore, it becomes possible to discriminate a symmetrical pattern definitely by the search.

Figure 14:
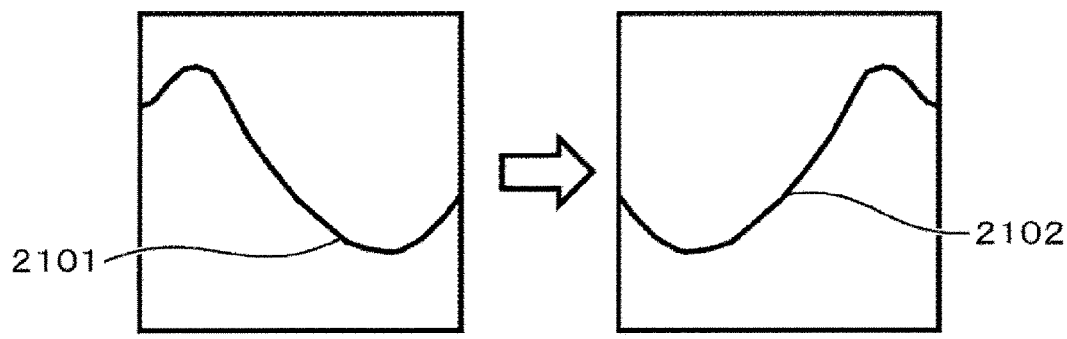
FIG. 14 is a diagram showing an example of a template for correlation value calculation created on the basis of partial extraction of a signal waveform.

As exemplified in, for example, FIG. 14, the inverted profile part is obtained by laterally inverting a signal waveform 2101 in the arbitrary area 520 on the secondary electron profile as indicated by an inverted waveform 2102. The secondary electron profile 401 is searched by using a template including such a waveform signal, and a correlation value in each position is calculated. By the way, the correlation value profile is created so as to cause a position where the correlation value exhibits a maximum value to coincide with a bottom part of the secondary electron profile 401.

As regards the symmetry profile 501, parts that are at least an arbitrary threshold 521 in signal quantity are stored as positions where a pattern exists (S5005). Among the positions, positions having a value greater than an arbitrary threshold 522 in the secondary electron profile 401 are recognized as pattern positions in the upper layer (center of gravity positions x514 and x515) (S5006). In the same way, positions having a value less than the arbitrary threshold 522 are recognized as pattern positions in the lower layer (center of gravity positions x511, x512 and x513) (S5007). A difference between respective center of gravity positions is found as a deviation quantity from recognized positions of the upper layer pattern and the lower layer pattern by using Equation (1) (S5008).

$$\text{Deviation quantity}=(x511+x512+x513)/3-(x514+x515)/2 \quad \text{Equation (1)}$$

It becomes possible to execute high precision overlay error measurement by discriminating a high luminance part and a low luminance part and measuring a dimension between a center of gravity (a first measurement reference) of a high luminance pattern and a center of gravity (a second measurement reference) of a low luminance pattern in this way.

Figure 16:
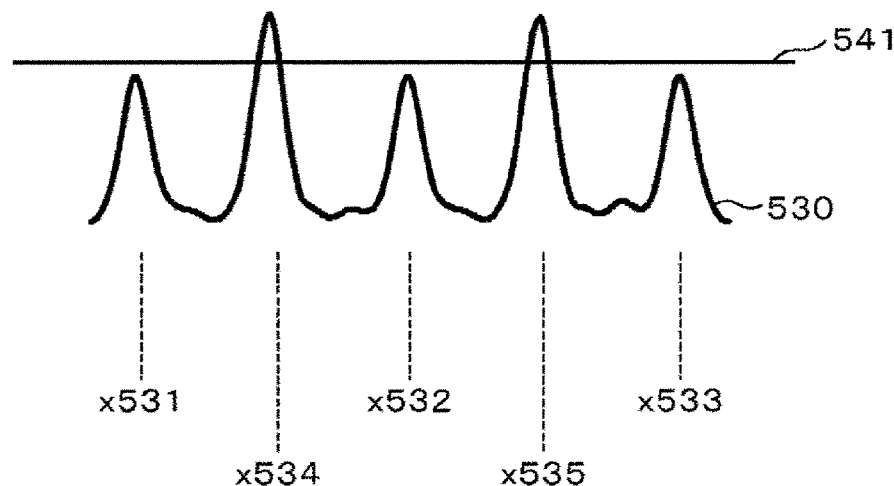
FIG. 16 is a diagram showing a different symmetry profile of a pattern that becomes a target of overlay error measurement.

A discrimination method of the upper layer pattern and the lower layer pattern will now be described with reference to a different symmetry profile 530 shown in FIG. 16 and obtained from the above-described secondary electron profile 401. A cause of difference from the symmetry profile 501 is difference in size of the arbitrary area 520 and so forth. A peak in the symmetry profile 530 that is at least an arbitrary threshold 521 can be judged to be an upper layer pattern. A peak in the symmetry profile 530 that is at most an arbitrary threshold 521 can be judged to be a lower layer pattern. The deviation quantity can be found by using values of x531 to x535 and Equation (1) in the same way as FIG. 5.

By the way, in the above-described example, both the center of gravity of the upper layer pattern and the center of gravity of the lower layer pattern are found by using the symmetry profile. As for the upper layer pattern, however, peaks indicating edges appear clearly in the secondary electron profile 401. For example, therefore, the center of gravity of the upper layer pattern may be set to be a center between peaks of the two edges. As for the lower layer pattern, however, it is better to conduct center of gravity position detection based upon the correlation value because of insufficient signal quantity. From the viewpoint of reduction of the number of processing processes, therefore, it is desirable to find both centers of gravity by conducting only the correlation value arithmetic operation. The signal quantity of the lower layer is small as compared with the upper layer. In executing high precision length measurement, therefore, it is very important to use a center of gravity position detection method suitable to the lower layer or conduct measurement based upon center of gravity position detection suitable to the layer between different layers.

Furthermore, a signal waveform formed on the basis of electrons obtained by arrival of the beam at the lower layer pattern is low in luminance as compared with other parts, and clear peaks cannot be obtained unlike the upper layer pattern. Therefore, the present technique for identifying the center of gravity position is effective to overlay error measurement using the layer pattern as one measurement reference.

Figure 5:
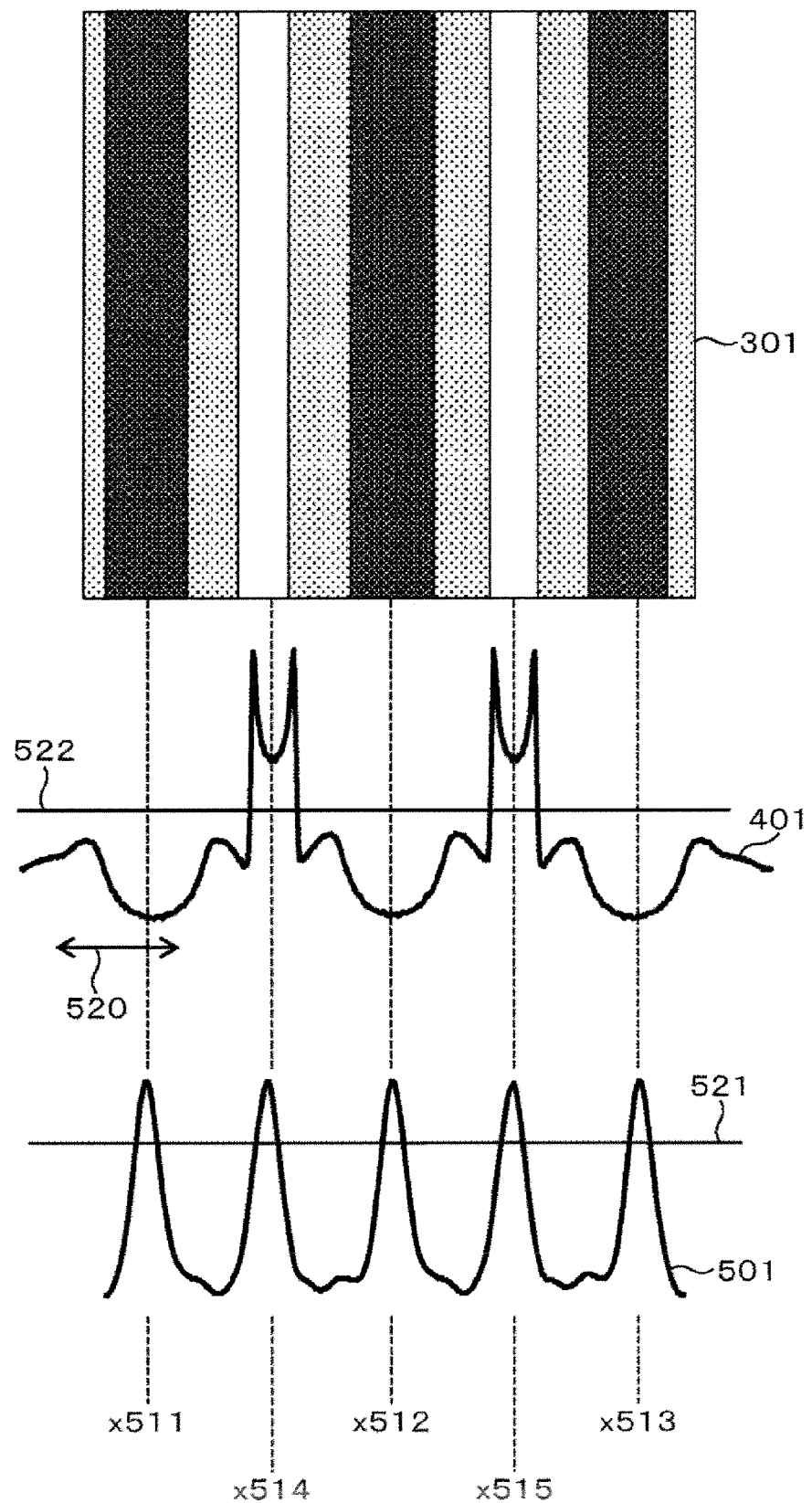
FIG. 5 is a diagram showing an electron microscope image, a secondary electron profile, and a symmetry profile of a pattern that becomes a target of overlay error measurement.
Figure 6:
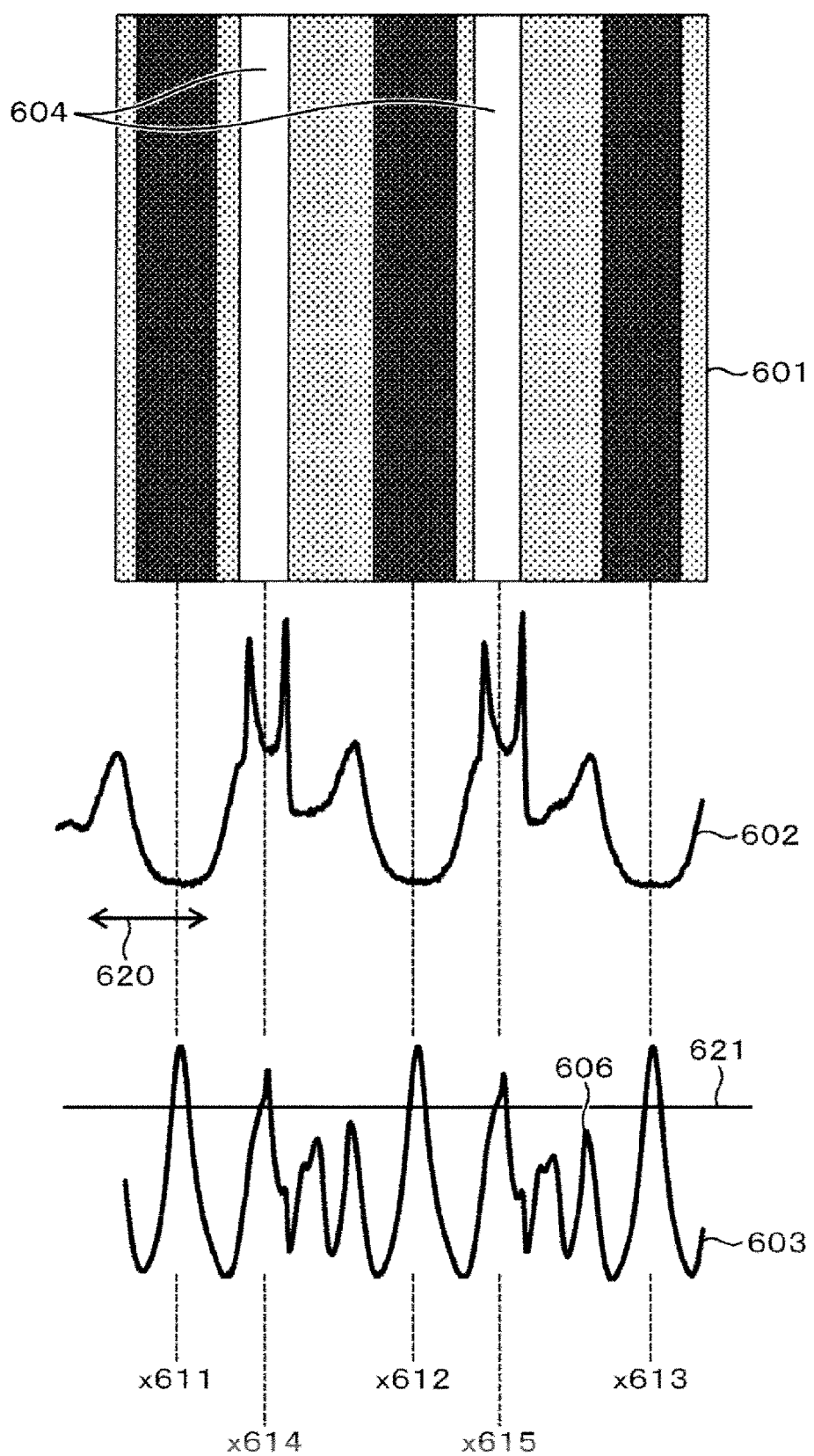
FIG. 6 is a diagram showing an electron microscope image, a secondary electron profile, and a symmetry profile of a pattern that becomes a target of overlay error measurement in which deviation between an upper layer and a lower layer is large.

FIG. 6 shows an electron microscope image 601 in a case where the deviation of the upper layer pattern is large, a created secondary electron profile 602, and a symmetry profile 603 created in a procedure similar to that of FIG. 5. Since the upper layer pattern 604 deviates to the left, it becomes difficult in the secondary electron profile 602 to separate pattern signals of the upper layer and the lower layer. Even in this case, it is possible to recognize parts that are in signal quantity at least an arbitrary threshold 621 as patterns, in the symmetry file 603 in the same way as the foregoing description. The deviation quantity can be calculated from positions (x611 to x615) of the recognized upper layer and lower layer by using Equation (1).

Figure 8:
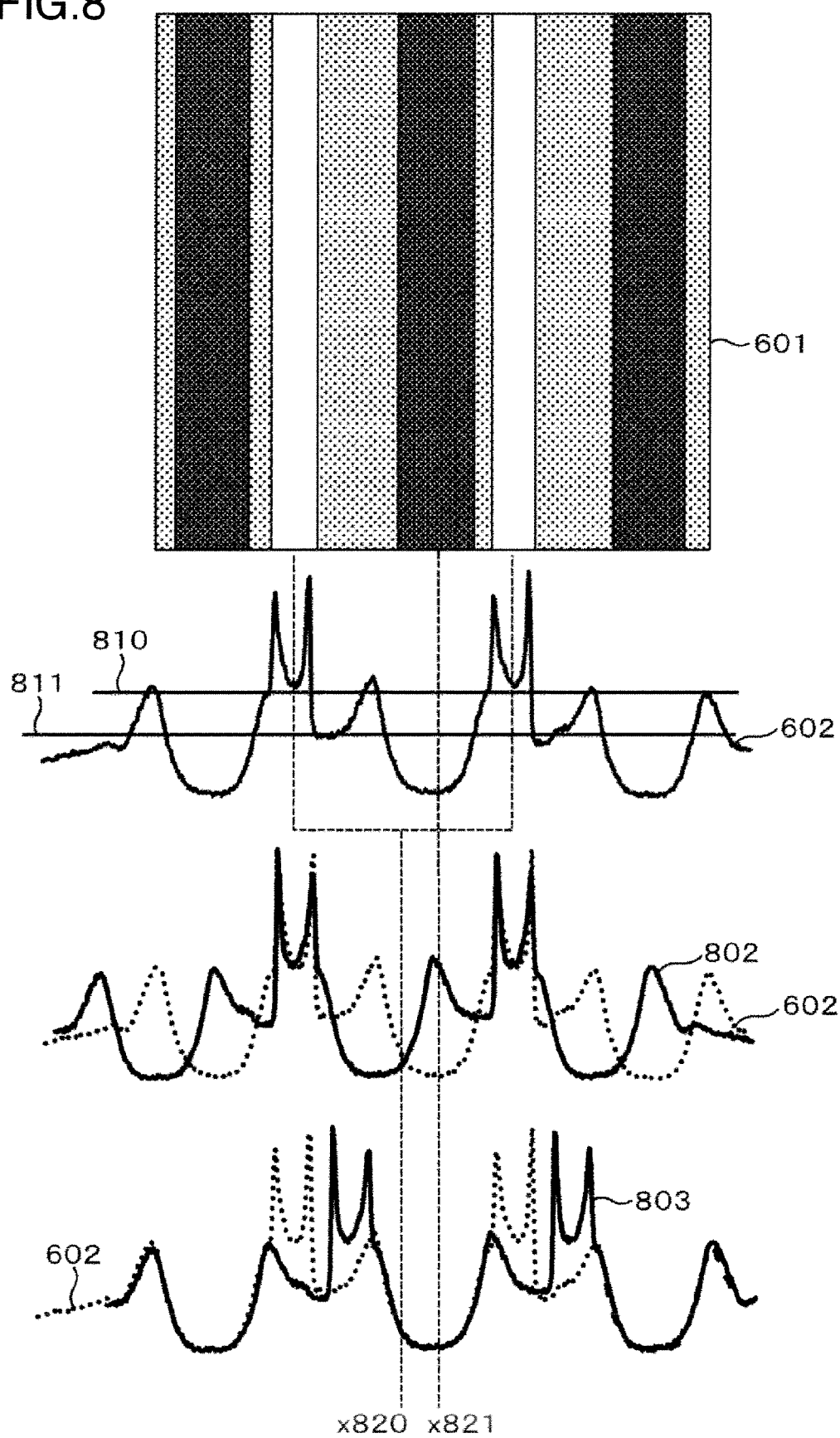
FIG. 8 is a diagram showing an outline of a gap discrimination method of a pattern in which a line width of a spacer has become small.
Figure 17:
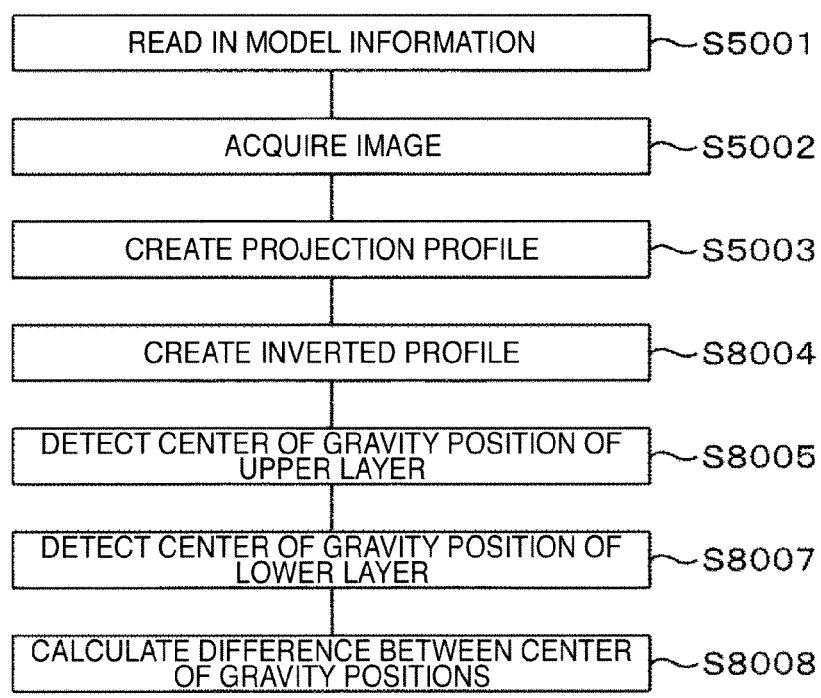
FIG. 17 is a flow chart showing a process of a different overlay error measurement.

In the symmetry profile 603, peaks corresponding to edge parts of the lower layer pattern approach the threshold, and there is a possibility of false recognition Against such a problem, a method of calculating the deviation quantity by utilizing the symmetry of pattern arrangement will now be described with reference to FIG. 8 and FIG. 17.

An inverted profile 802 is created by laterally interchanging the secondary electron profile 602 (S8004). With respect to the secondary electron profile 602, a part greater than an arbitrary threshold 810 and the inverted profile 802 are scanned, and a position where the correlation value becomes maximum is set to be a center of gravity position x820 of the upper layer pattern (S8005). By the way, the correlation value is calculated for only overlapping parts. In the same way, with respect to the secondary electron profile 602, a part smaller than an arbitrary threshold 811 and the inverted profile 802 are scanned, and a position where the correlation value becomes maximum is set to be a center of gravity position x821 of the lower layer pattern (S8007). The deviation quantity is calculated from the found positions by using Equation (2).

$$\text{Deviation quantity}=x821-x820 \quad \text{Equation (2)}$$

Heretofore, the method for detecting the deviation quantity by using the symmetry of the pattern itself and the symmetry of the pattern arrangement has been described. The present method is premised on that a symmetrical secondary electron profile is obtained in the pattern part.

Figure 7:
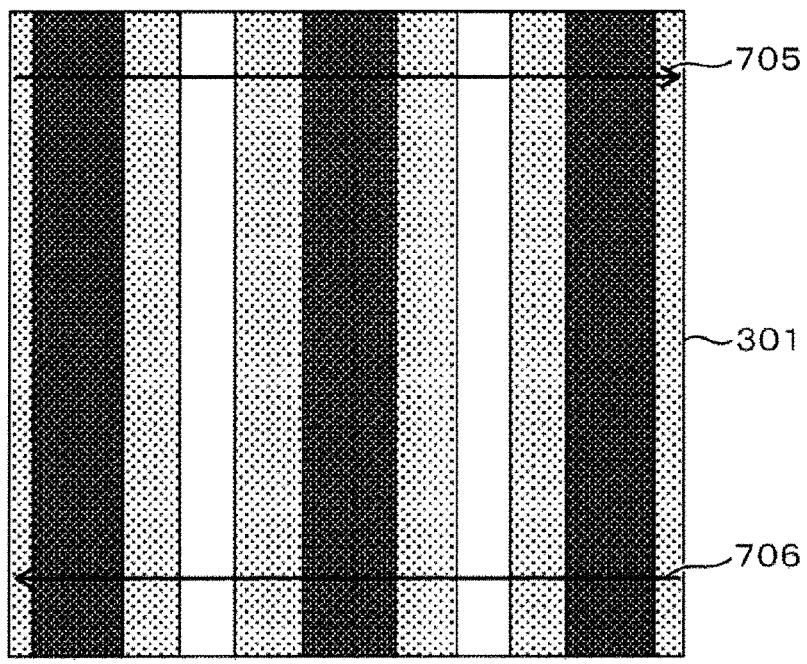
FIG. 7 is a diagram showing an electron microscope image of a pattern that becomes a target of overlay error measurement, a secondary electron profile of two upper layer patterns, and an averaged profile.
Figure 7:
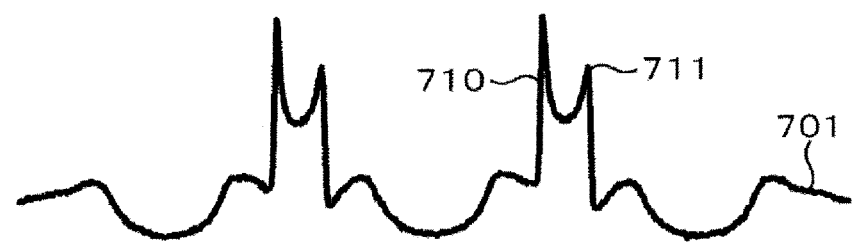
Figure 7:
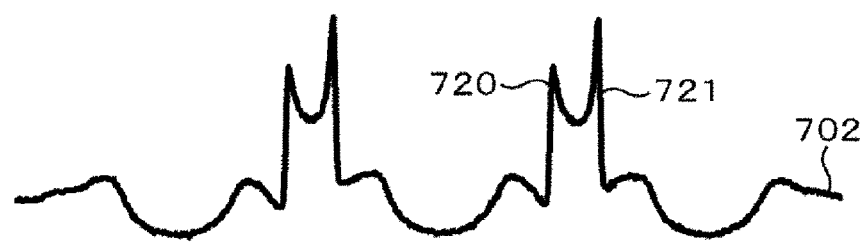
Figure 7:
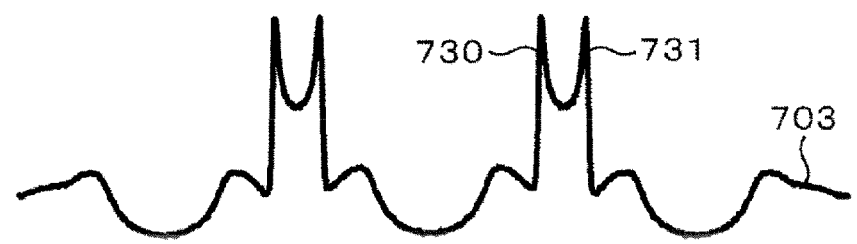

Hereafter, processing in a case where the profile has become non-symmetrical due to charging caused by scanning with the electron beam or in a case where the pattern itself is non-symmetrical will be described with reference to FIG. 7 and FIG. 18.

As described with reference to FIG. 1, the top of the sample is scanned two-dimensionally with the electron beam by the deflection coils 9 which receive a signal from the deflection signal control unit 122 via the deflection signal control unit 120. Since the deflection signal in the secondary electron image display device 124 is in synchronization with the deflection signal of the deflection coils, this scanning method becomes ordinary interlace scanning. In this case, the scan direction becomes unidirectional scanning 705 from the left to the right in FIG. 7. Between the left and right of a pattern edge, therefore, a difference occurs in a quantity of occurrence of secondary electrons and a quantity of return of secondary electrons. As a result, the difference in charging between the left and right edges becomes large every scanning line and every frame. This difference becomes remarkable at the left and right edge parts of the upper layer pattern where a large number of secondary electrons are generated by the edge effect (left edge 710 and right edge 711). In order to mitigate this phenomenon, scanning 706 from the right to the left contrary to the scan direction 705 is executed. In a secondary electron profile 702 obtained at this time, non-symmetry of the left and right edges becomes opposite as compared with a secondary electron profile 701 described above (left edge 720 and right edge 721).

In the present embodiment, model information which will be described later is read into the image processing processor 123 (S7001), scan mode 1 information which is a part of the model information is set in the deflection signal control unit 122 (S7002), scanning in the scan direction 705 is executed, and an image 1 is acquired and taken into the image processing processor 123 (S7003). In the same way, a scan mode 2, in which scanning is conducted in an opposite direction differing by 180 degrees, is set (S7004), then scanning in the scan direction 706 is executed, and an image 2 is taken into the image processing processor (S7005).

A profile 1 is obtained by projection processing on the image 1 (S7006). In the same way, a profile 2 is obtained from the image 2 (S7007). An example of the profile 1 and the profile 2 is indicated by the secondary electron profile 701 and the secondary electron profile 702 in FIG. 7. In the secondary electron profile 701, signal intensity at the right edge 711 becomes higher than that at the left edge 710. In the secondary electron profile 702, signal intensity at the right edge 721 becomes lower than that at the left edge 720. Then, a synthetic profile 703 is created from the profile 1 and the profile 2. The synthesis may be conducted by simple averaging, or weighting can be conducted by using the signal strength.

As a result, the left and right edges in the synthetic profile 703 become nearly the same in height (left edge 730 and right edge 731).

In the ensuing processing, the difference can be calculated in accordance with a procedure similar to S5005 to S5008. By the way, in order to obtain the secondary electron profile 701 and the secondary electron profile 702, scanning in the scan direction 705 and scanning in the scan direction 706 can be assigned to odd-numbered fields and even-numbered fields of the interlace scan. Furthermore, the difference can be found by conducting additional averaging on two images obtained by scanning with raster rotation set to 0 degree and 180 degrees. As for the addition method as well, it is also possible to conduct addition after executing position alignment every profile or image of every scan.

Figure 9:
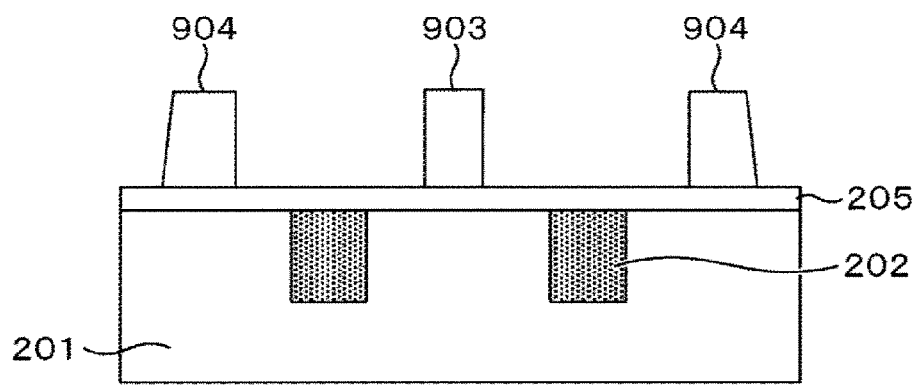
FIG. 9 is a sectional view of a pattern that becomes a target of overlay error measurement.
Figure 10:
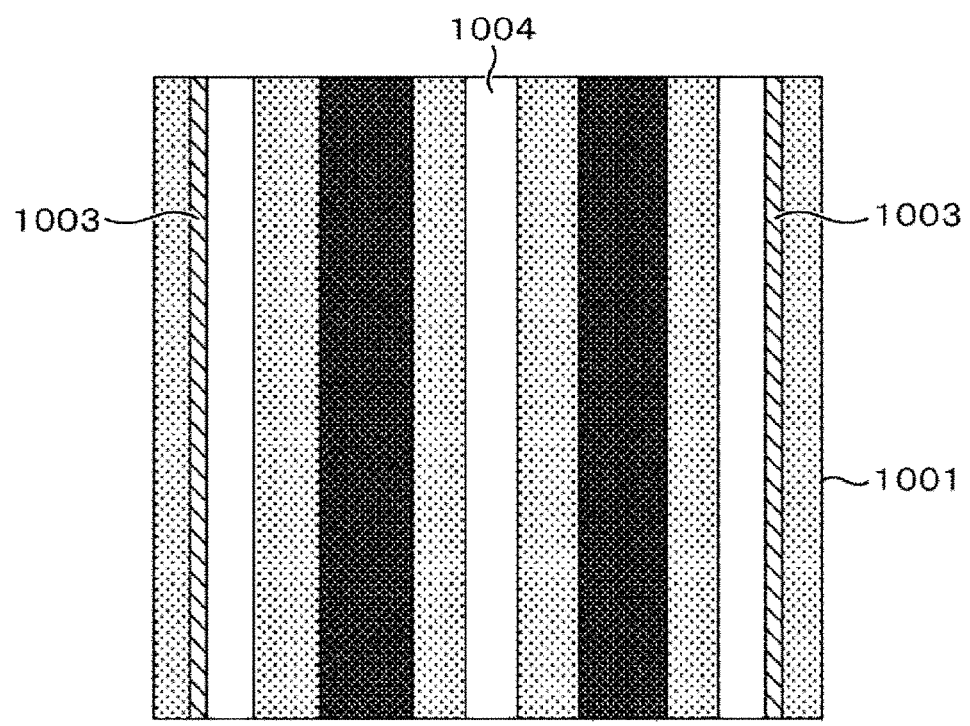
FIG. 10 is a diagram showing an example of an electron microscope image of a pattern that becomes a target of overlay error measurement.

In some cases, the pattern itself becomes non-symmetrical because of non-uniformity of light energy density or the like at the time of pattern exposure. In such a pattern, the precision of the overlay measurement is lowered. Therefore, processing conducted by evaluating the symmetry of the pattern itself will now be described with reference to FIGS. 9 to 12. FIG. 9 shows an example of a sectional view of an overlay pattern including a non-symmetrical pattern. In the lower layer pattern 202 formed in the wafer 201 and a pattern formed on the reflection preventing film 205 in the same way as FIG. 2, outside patterns 904 have gentle outside slopes as compared with an inside pattern 903. FIG. 10 shows an electron microscope image 1001 obtained when such an overlay pattern is observed. An area 1003 corresponding to the outside slope of the outside pattern 904 of the upper layer becomes low in luminance as compared with the left edge. On the other hand, in a part 1004 corresponding to the inside pattern 903, luminance differences at the left and right edges are nearly equal.

Figure 11:
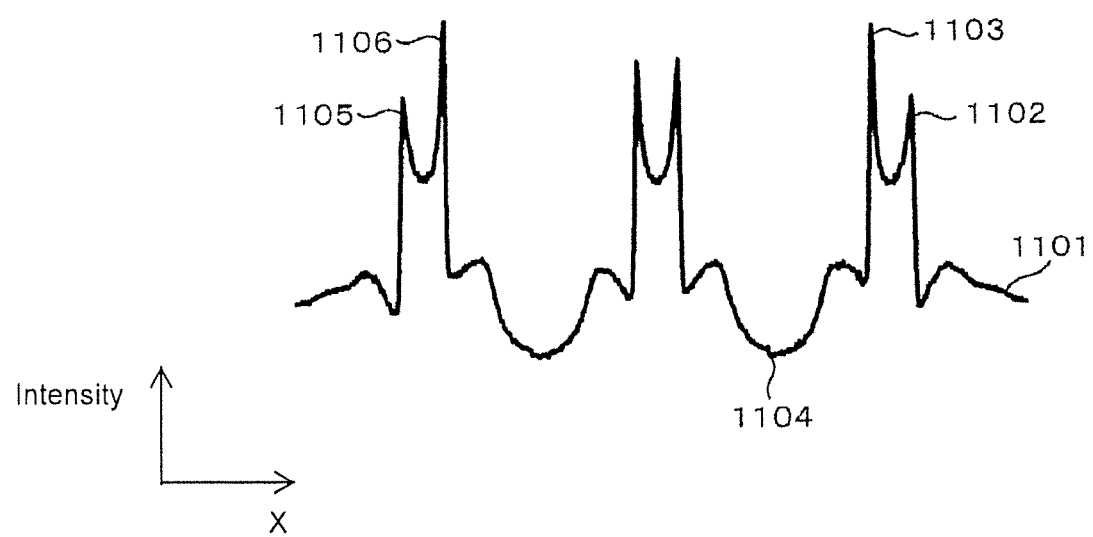
FIG. 11 is a diagram showing a secondary electron profile of a pattern that becomes a target of overlay error measurement.
Figure 12:
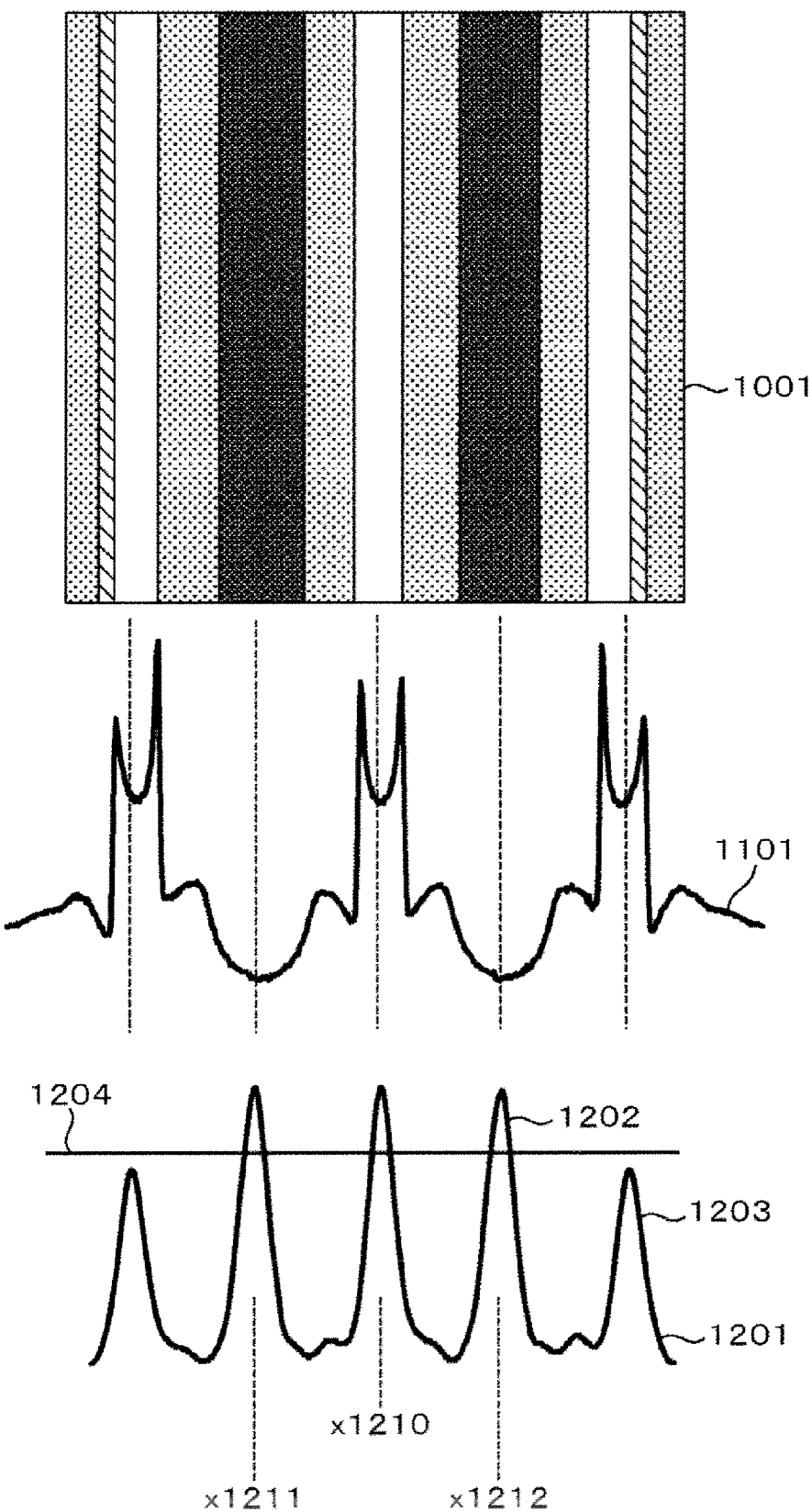
FIG. 12 is a diagram showing an electron microscope image, a secondary electron profile, and a symmetry profile of a pattern that becomes a target of overlay error measurement.

FIG. 11 shows a secondary electron profile 1101 found from the electron microscope image 1001. On the secondary electron profile as well, in left and right outside upper layer patterns, respective outside edges are low in luminance (outside edge luminance 1102 and 1105), and respective inside edges are high in luminance (inside edge luminance 1103 and 1106).

By the way, it is now supposed that the lower layer pattern is a symmetrical pattern. A symmetry profile 1201 is created in the same way as the procedure described with reference to FIG. 15 and FIG. 17. Then, parts that are in signal quantity at least an arbitrary threshold 1204 are recognized as patterns, and a center of gravity position (x1210) of the upper layer pattern and center of gravity positions (x1211 and x1212) of the lower layer pattern are determined respectively. Then, a center of gravity is found for only the lower layer pattern, and a difference from the position of the upper layer pattern is found by Equation (3) as the deviation quantity.

$$\text{Deviation quantity} = x1210 - (x1211 + x1212)/2 \qquad \text{Equation (3)}$$

Figure 13:
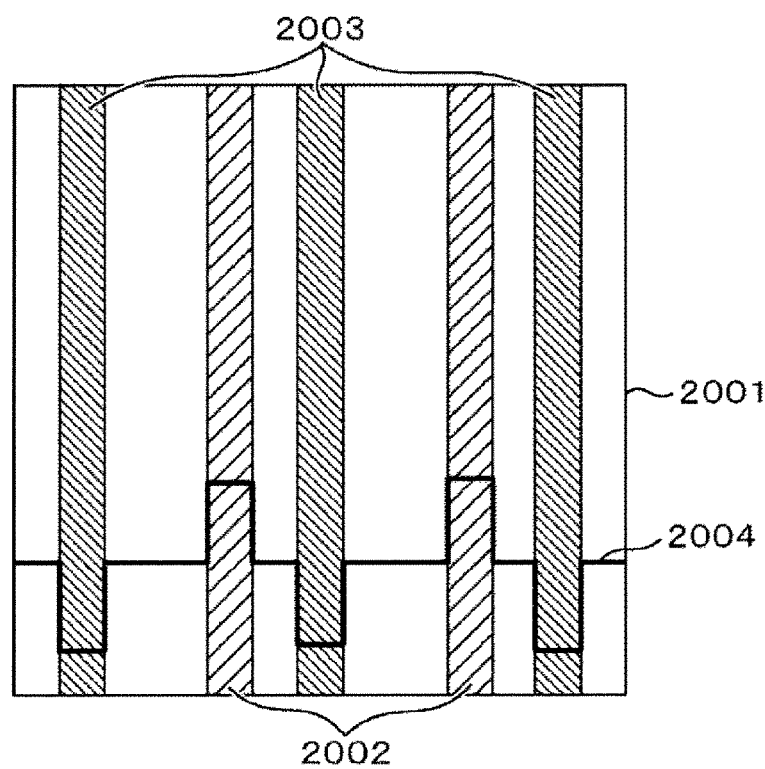
FIG. 13 is a diagram showing an example of a GUI screen for setting parameters of overlay pattern measurement.
Figure 13:
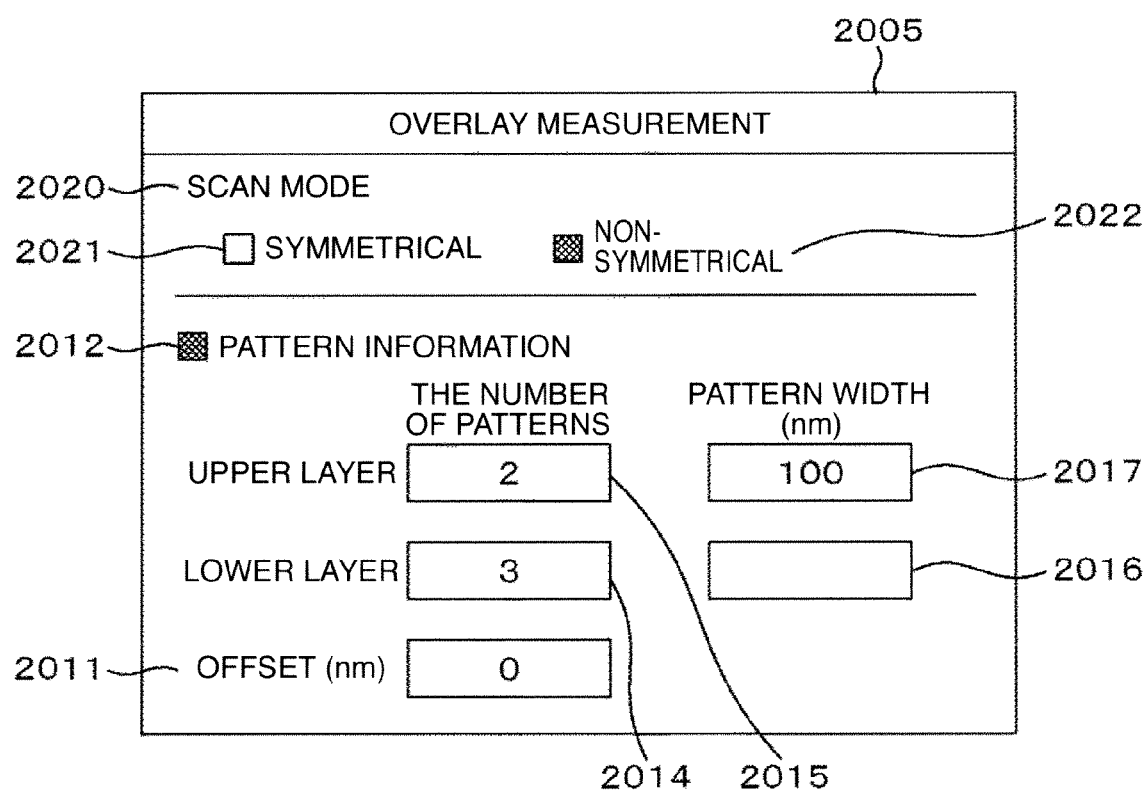

FIG. 13 shows a screen 2010 for setting parameters of overlay pattern measurement. This screen is displayed on the secondary electron image display device 124 shown in FIG. 1. The operator confirms the symmetry of the secondary electron profile described with reference to FIG. 7, and determines a scan mode 2020. In a case of a non-symmetrical profile, a scan that mitigates the non-symmetry is selected. In a case where a symmetry selection check box 2021 is selected, the flow shown in FIG. 17 is not executed. In a case where a non-symmetry selection check box 2022 is selected, a profile is created by the flow shown in FIG. 17. Then, it is selected by a pattern information check box 2012 whether to use pattern information.

Figure 15:
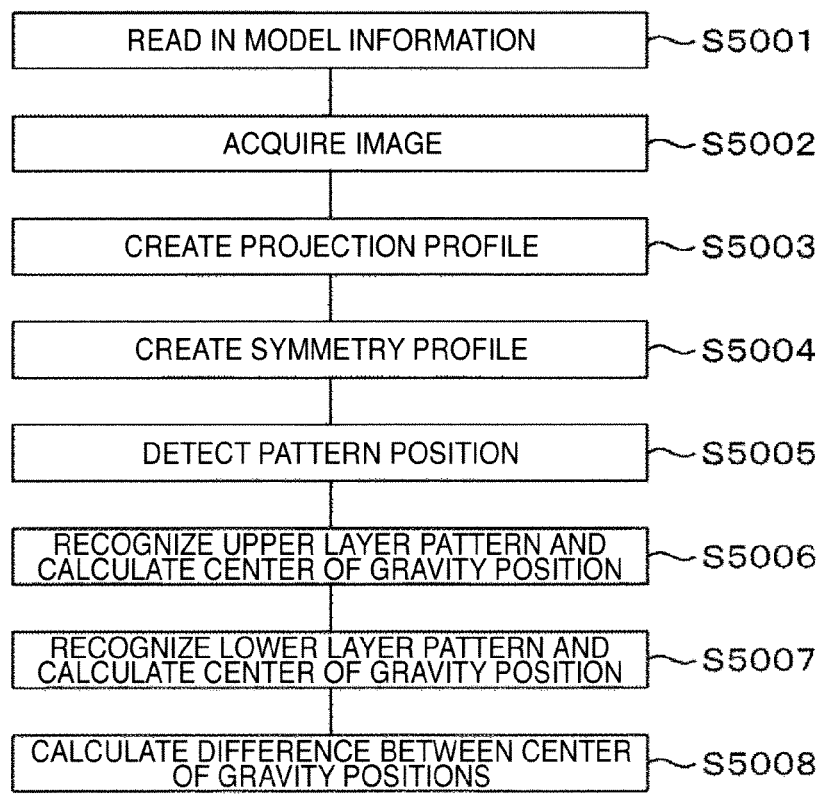
FIG. 15 is a flow chart showing a process of overlay error measurement.

In a case where pattern information is not used, a procedure described with reference to FIGS. 5 and 15, and FIG. 6 is executed. As for the arbitrary threshold 522, a statistical value, such as, for example, an average value or a median of the secondary electron profile 401, is used.

In a case where pattern information is used, respective values are input from a box 2015 for inputting the number of patterns of the upper layer and a box 2014 for inputting the number of patterns of the lower layer. The number of patterns is used to determine the arbitrary threshold 521 or the threshold 541, the arbitrary threshold 621, and the arbitrary threshold 1204 in the position detection of the upper layer pattern and the lower layer pattern (S5005). For example, the arbitrary threshold 621 is raised or lowered to cause the number of upper layer patterns and the number of lower layer patterns to coincide with input values. In addition, the operator can also input respective values from an upper layer pattern width input box 2017 and a lower layer pattern width input box 2016. These values are used as the arbitrary area 520 or an arbitrary area 620 to be used when creating a symmetry profile. Unless these values are input, arbitrary values may be used, or values can be changed suitably and optimized by using the sharpness or the like of the peak in the pattern position of the symmetry profile. By the way, the number of patterns and the pattern width of the upper layer and the lower layer can be read out and used on the basis of design data. Information of the number of patterns and the pattern width is registered as model information. As for this model information, patterns on the same wafer as a measurement target pattern for which detection processing of the center of gravity positions of the upper layer pattern and the lower layer pattern is conducted may be used, or model information acquired on a representative wafer may be used repetitively for all wafers of the measurement target. In a case where registration is conducted every target wafer, workmanship of the patterns are the same degree in the model and the measurement target. As a result, there is an advantage that discrimination can be conducted more accurately. However, the operator must input every time. In this case, an automatic mode is set and changeover to a manual mode can be conducted as occasion demands. In a case where the manufacturing process is stable and the measurement is used for monitoring, this method is sufficient. An offset 2011 is used to make the overlay measurement value equal to zero by inputting known deviation in design in a case where the number of upper layer patterns and the number of lower layer patterns are the same.

The case where center of gravity detection is conducted for both the upper layer pattern and the lower layer pattern and the overlay is measured has been described heretofore. However, it is also possible to calculate only the lower layer pattern by using the symmetry profile, calculate the center of gravity of the upper layer pattern by using the conventional left and right edge detection method, and use a combination of them to find deviation quantity.

REFERENCE SIGNS LIST

101: Electron source
102: Extraction electrode
103: Primary electron beam
104: First condenser lens
105: Diaphragm
106: Second condenser lens
107: Secondary electron detector
108: Alignment coil
109: Deflection coil
110: Object lens
111, 201: Wafer
112: Stage
113: Sample chamber
114: Secondary electron
115: High voltage control device
116: First condenser lens control unit
117: Second condenser lens control unit
118: Secondary electron signal amplifier
119: Alignment control unit
120, 122: Deflection signal control unit
121: Object lens control unit
123: Image processing processor
124: Secondary electron image display device
125: General control unit
126: Electro-optical system control device
127: Stage control device
128: User interface
202, 203: Lower layer pattern
204: Upper layer pattern
205: Reflection preventing film
301, 1001: Electron microscope image
302: Secondary electron signal part from a wafer surface which is a base
303: Part that is low in luminance and that looks black
304: Part that is high in luminance and that looks white
401: Secondary electron profile
402: Upper layer pattern profile
403: Lower layer pattern profile
501, 1201: Symmetry profile
x511, x512, x513, x514, x515: Center of gravity position
x531, x532, x533, x1211, x1212: Center of gravity position of each pattern of lower layer
x534, x535: Center of gravity position of each pattern of upper layer
520: Arbitrary area
521, 522, 621, 810, 811, 1204: Arbitrary threshold
530: Different symmetry profile
601: Electron microscope image in case where deviation is large
602, 701, 702, 1101: Secondary electron profile
603: Symmetry profile in case where deviation is large
703: Synthetic profile
710, 720, 730: Left edge
711, 721, 731: Right edge
802: Inverted profile
x820, x1210: Center of gravity position of upper layer pattern
x821: Center of gravity position of lower layer pattern
903: Inside pattern
904: Outside pattern
1003: Area on electron microscope image corresponding to non-symmetrical pattern slope
1102, 1105: Outside edge luminance
1103, 1106: Inside edge luminance
1104: Luminance of right edge of inside pattern on secondary electron profile
2010: Screen for setting parameters of overlay pattern measurement
2011: Offset input box
2012: Pattern information check box
2014: Box for inputting the number of lower layer patterns
2015: Box for inputting the number of upper layer patterns
2016: Lower layer pattern width input box
2017: Upper layer pattern width input box
2020: Scan mode
2021: Symmetry selection check box
2022: Non-symmetry selection check box

The invention claimed is:
1. A sensor that improves measurements of an overlay error between a pattern in a first layer formed on a sample and a pattern in a second layer formed on the sample, which is different from the first layer, the sensor comprising:

a plurality of electron detectors that generate a luminance signal based electrons capture from the sample, wherein the electrons are emitted by the sample when irradiated by a primary electron beam of a charged particle beam device;
a processor communicatively coupled to the plurality of electron detectors;
wherein the processor is configured to:
receive the luminance signal from the plurality of electronic detectors via a signal amplifier
generate a signal waveform from the luminance signal, wherein the signal waveform represents a luminance of an upper layer and a lower layer;
determine a first part of the signal waveform having a luminance equal to or lower than a predetermined value,
determine a second part of the signal waveform having a luminance equal to or greater than the predetermined value,
generate a first correlation profile by searching the first part of the signal waveform using a first partial waveform, wherein the first partial waveform is generated by inverting a part of the signal waveform of the first part with respect to a wave positional axis,
seta first measurement reference point at a position corresponding to a peak of the first correlation profile,
seta second measurement reference point at a position corresponding to a center of the second part of the signal waveform,
perform a measurement with the first measurement reference point and the second measurement reference point;
calculates the overlay error by using the measurement, and
output the overlay error calculated.

2. The sensor according to claim 1, wherein the predetermined value is set such that:
the first part of the signal waveform includes a first signal waveform from the pattern in the upper layer, and
the second part of the signal waveform includes a second signal waveform from the pattern in the lower layer.

3. The sensor to claim 2, wherein the processor is further configured to:
extract two or more first measurement references points from the first correlation profile,
extract two or more second measurement references points from the second part of the signal waveform, and
measure a dimension between a first center of gravity position of the two or more first measurement references points and a second center of gravity position of the two or more second measurement references points.

4. The sensor according to claim 3, wherein the upper layer is a lower layer than the lower layer.

5. The sensor according to claim 1, wherein the second measurement reference are extracted by:
generating a second correlation profile by searching the second part of the signal waveform using a second partial waveform;
generating the second partial waveform from a part of the signal waveform of the second part by inverting the part of the signal waveform of the second part with respect to a wave positional axis;
finding second correlation between the signal waveform of the second part and the second partial waveform, and forming a second correlation profile which indicates the second correlation; and
setting the second measurement reference point at a position corresponding to a peak of the second correlation profile.

6. The sensor according to claim 5, wherein the predetermined value is set such that the first part of the signal waveform includes a first signal waveform from the pattern in the upper layer and the second part of the signal waveform includes a second signal waveform from the pattern in the lower layer.

7. The sensor according to claim 6, wherein:
extract two or more first measurement references points from the first correlation profile,
extract two or more second measurement references points from the second part of the signal waveform, and
measure a dimension between a first center of gravity position of the two or more first measurement references points and a second center of gravity position of the two or more second measurement references points.

8. A non-transitory computer readable medium storing a program for improving measurement of an overlay error between a pattern in a first layer formed on a sample and a pattern in a second layer formed on the sample, which is different from the first layer, wherein the program, when executed by a processor, causes the processor to:
receive a luminance signal from a plurality of electron detectors via a signal amplifier, wherein the luminance signal is generated by the plurality of electron detectors based on electrons that are emitted by the sample when irradiated by a primary electron beam of a charged particle beam device;
generate a signal waveform from the luminance signal, wherein the signal waveform represents a luminance of an upper layer and a lower layer;
determine a first part of the signal waveform having a luminance equal to or lower than a predetermined value; and
determine a second part of the signal waveform having a luminance equal to or greater than the predetermined value;
generate a first correlation profile by searching the first part of the signal waveform using a first partial waveform, wherein the first partial waveform is generated by inverting a part of the signal waveform of the first part with respect to a wave positional axis;
set a first measurement reference point at a position corresponding to a peak of the first correlation profile;
set a second measurement reference point at a position corresponding to a center of the second part of the signal waveform;
perform a measurement with the first measurement reference point and the second measurement reference point;
calculate the overlay error by using the measurement; and
output the overlay error.

9. The non-transitory computer readable medium according to claim 8, wherein the predetermined value is set such that:
the first part of the signal waveform includes a first signal waveform from the pattern in the upper layer, and
the second part of the signal waveform includes a second signal waveform from the pattern in the lower layer.

10. The non-transitory computer readable medium according to claim 9, wherein the program further causes the processor to:
extract two or more first measurement references points from the first correlation profile, extract two or more second measurement references points from the second part of the signal waveform, and measure a dimension between a first center of gravity position of the two or more first measurement references points and a second center of gravity position of the two or more second measurement references points.

11. The non-transitory computer readable medium according to claim 10, wherein the upper layer is a lower layer than the lower layer.

12. The non-transitory computer readable medium according to claim 8, wherein the second measurement reference point are extracted by:

generating a second correlation profile by searching the second part of the signal waveform using a second partial waveform;

generating the second partial waveform from a part of the signal waveform of the second part by inverting the part of the signal waveform of the second part with respect to a wave positional axis;

finding second correlation between the signal waveform of the second part and the second partial waveform, and forming a second correlation profile which indicates the second correlation; and setting the second measurement reference point at a position corresponding to a peak of the second correlation profile.

13. The non-transitory computer readable medium according to claim 12, wherein the predetermined value is set such that:

the first part of the signal waveform includes a first signal waveform from the pattern in the upper layer, and the second part of the signal waveform includes a second signal waveform from the pattern in the lower layer.

14. The non-transitory computer readable medium according to claim 13, wherein:

extract two or more first measurement references points from the first correlation profile, extract two or more second measurement references points from the second part of the signal waveform, and measure a dimension between a first center of gravity position of the two or more first measurement reference points and a second center of gravity position of the two or more second measurement references points.

* * * * *